US011668777B2

(12) United States Patent
Wang et al.

(10) Patent No.: US 11,668,777 B2
(45) Date of Patent: Jun. 6, 2023

(54) ADAPTIVE JOINT SPARSE CODING-BASED PARALLEL MAGNETIC RESONANCE IMAGING METHOD AND APPARATUS AND COMPUTER READABLE MEDIUM

(71) Applicant: SHENZHEN INSTITUTES OF ADVANCED TECHNOLOGY, Guangdong (CN)

(72) Inventors: Shanshan Wang, Guangdong (CN); Dong Liang, Guangdong (CN); Sha Tan, Guangdong (CN); Xin Liu, Guangdong (CN); Hairong Zheng, Guangdong (CN)

(73) Assignee: SHENZHEN INSTITUTES OF ADVANCED TECHNOLOGY, Guangdong (CN)

( * ) Notice: Subject to any disclaimer, the term of this patent is extended or adjusted under 35 U.S.C. 154(b) by 429 days.

(21) Appl. No.: 16/760,956

(22) PCT Filed: Dec. 1, 2017

(86) PCT No.: PCT/CN2017/114172
§ 371 (c)(1),
(2) Date: May 1, 2020

(87) PCT Pub. No.: WO2019/104702
PCT Pub. Date: Jun. 6, 2019

(65) Prior Publication Data
US 2020/0256942 A1 Aug. 13, 2020

(51) Int. Cl.
*G01R 33/561* (2006.01)
*G01R 33/56* (2006.01)
*G06T 11/00* (2006.01)

(52) U.S. Cl.
CPC ...... *G01R 33/5611* (2013.01); *G01R 33/5608* (2013.01); *G06T 11/008* (2013.01);
(Continued)

(58) Field of Classification Search
CPC ............ G01R 33/5611; G01R 33/5608; G06T 11/008; G06T 2207/10088;
(Continued)

(56) References Cited

FOREIGN PATENT DOCUMENTS

CN 103049923 A 4/2013
CN 104376198 A 2/2015
(Continued)

OTHER PUBLICATIONS

Wang et al., "Learning Joint-Sparse Codes for Calibration-Free Parallel MR Imaging", IEEE Transactions on Medical Imaging, vol. 37, No. 1. (Year: 2018).*
(Continued)

*Primary Examiner* — Susan S Lee
(74) *Attorney, Agent, or Firm* — Duane Morris LLP

(57) ABSTRACT

Provided are a parallel magnetic resonance imaging method and apparatus based on adaptive joint sparse codes and a computer-readable medium. The method includes solving an $l_2$–$l_F$–$l_{2,1}$ minimization objective, where the $l_2$ norm is a data fitting term, the $l_F$ norm is a sparse representation error, and the $l_{2,1}$ mixed norm is the joint sparsity constraining across multiple channels; separately updating each of a sparse matrix, a dictionary and K-space data with a corresponding algorithm, and obtaining a reconstructed image by a sum of root mean squares of all the channels. The joint sparsity of the channels is developed using the norm $l_{2,1}$. In this manner, calibration is not required while information sparsity is developed. Moreover, the method is robust.

18 Claims, 2 Drawing Sheets

(52) U.S. Cl.
CPC .............. *G06T 2207/10088* (2013.01); *G06T 2207/20056* (2013.01); *G06T 2207/20081* (2013.01)

(58) Field of Classification Search
CPC . G06T 2207/20056; G06T 2207/20081; G06T 5/00
See application file for complete search history.

(56) References Cited

FOREIGN PATENT DOCUMENTS

| | | |
|---|---|---|
| CN | 104484886 A | 4/2015 |
| CN | 105931242 A | 9/2016 |
| CN | 108154484 A | 6/2018 |
| EP | 3132742 A1 | 2/2017 |

OTHER PUBLICATIONS

International Search Report issued in connection with International Patent Application No. PCT/CN2017/114172, dated Aug. 28, 2018, 5 pages.

Tan, Sha, et al., "The Parallel Magnetic Resonance Reconstruction Method Based on Adaptive Sparse Representation", Journal of Integration Technology, vol. 5, No. 3, May 15, 2018, 6 pages.

* cited by examiner

ADAPTIVE JOINT SPARSE CODING-BASED PARALLEL MAGNETIC RESONANCE IMAGING METHOD AND APPARATUS AND COMPUTER READABLE MEDIUM

CROSS-REFERENCES TO RELATED APPLICATIONS

This is a U.S. National Stage Application, filed under 35 U.S.C. 371, of International Patent Application No. PCT/CN2017/114172, filed on Dec. 1, 2017, the content of which is incorporated herein by reference in its entirety.

TECHNICAL FIELD

The present disclosure relates to a magnetic resonance imaging field and, in particular, to a parallel magnetic resonance imaging method and apparatus based on adaptive joint sparse codes and a computer-readable medium.

BACKGROUND

At present, to improve the speed of magnetic resonance imaging, parallel magnetic resonance imaging based on compressed perceptual is popular. According to the use of sensitivity information, reconstruction methods are divided into three types: accurate calibration, automatic calibration, and calibration-free. In combination with prior information, the calibration-free method has relatively good robustness in terms of sensitivity information. The automatic calibration does not depend on the accurate prediction of sensitivity information. A K-space self-calibration sensitivity method includes generalized auto-calibrating partially parallel acquisitions (GRAPPA) and L1-iterative self-consistent parallel imaging reconstruction (L1-SPIRiT), and the image reconstruction quality of these methods is relatively good. However, as the acceleration multiple increases, the performance of these algorithms decreases. In response to the defect, algorithms such as JSENSE, Sparse BLIP are provided, in which undersampled images can be estimated while the sensitivity information is estimated. However, simultaneous estimation is a nonconvex problem that is sensitive to the initial value of the sensitivity and involves a complex calculation. The calibration-free reconstruction method does not require special calibration information to estimate the sensitivity. The image is reconstructed in a K-space or an image domain through the relation between channels. However, the existing calibration-free reconstruction method utilizes the joint sparsity only in a transformation domain.

SUMMARY

In response to the above problems of the existing art, the present disclosure proposes a method and apparatus for parallel magnetic resonance imaging based on adaptive joint sparse codes. Based on block sparsity, the method and apparatus for parallel magnetic resonance imaging based on adaptive joint sparse codes can improve sparsity, and can ensure the reconstruction quality while further increasing the acceleration multiple.

The present disclosure provides a parallel magnetic resonance imaging method based on adaptive joint sparse codes. The method includes the steps described below.

In step a, a calibration-free parallel magnetic resonance imaging model based on joint sparse codes, that is, a reconstructed model is constructed, where the model is defined as the formula described below.

$$\{V^*, D^*, X^*\} = \theta(X, v_j, f_j, D) = \underset{V,D,X}{\operatorname{argmin}} \left\{ \frac{\lambda}{2} \sum_{j=1}^{J} \|F_M v_j - f_j\| + \sum_{l=1}^{L} (\|R_l V - DX_l\|_F^2 + \beta \|X_l\|_{2,1}) \right\}. \quad (1)$$

In the formula, V denotes a reconstructed image, $D \in c^{M \times P}$ denotes an overcomplete (P>>M) dictionary, $\theta$ denotes an objective function, $X = (X_{l,1} | X_{l,2} \ldots X_{l,j} \ldots, |X_{l,j}) \in c^{p \times j}$ denotes a sparse matrix, $X_{l,j} \in c^P$ denotes an l-th extracted patch from a j-th channel image, $F_M$ denotes a Fourier transformation, $v_j$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vectorized size of the image, P denotes a number of atoms, a subscript F denotes the Fourier transformation, $\lambda$ denotes a data fitting term weight, $\beta$ denotes a joint sparse regularization weight, and $\| \|_{2,1}$ denotes a joint sparse term.

In the formula, $\|X_l\|_{2,1} = \Sigma_{p=1}^{P} \sqrt{\Sigma_{j=1}^{J} X_{l_p,j}^2}$, $X_{l_p,j}^2$ denotes a p-th pixel for the l-th extracted patch from the j-th channel image.

In step b, X is temporarily fixed, and the dictionary D is learned by using a gradient descent method.

$$D^{k+1} = D^k - \gamma \frac{\partial \theta(D)}{\partial(D)}. \quad (2)$$

In the formula, $\gamma$ denotes a learning rate, and k denotes a number of iterations.

$$\frac{\partial \theta(D)}{\partial(D)} = (DX - R_l V) X^H$$

applies, the formula $$\frac{\partial \theta(D)}{\partial(D)} = (DX - R_l V) X^H$$

denotes a reciprocal of the reconstructed objective function to the dictionary D, and H denotes conjugate transpose.

Therefore, the formula is obtained as below.

$$D^{k+1} = D^k - \gamma (DX - R_l V) X^H \quad (3).$$

In step c, the joint sparse coefficient X is updated.

In step d, $v_j$ is updated by using the formula described as below.

$$v_j^{k+1} = \theta(X^{k+1}, v_j, f_j^k) = \underset{v_j}{\arg\min} \left\{ \frac{\lambda}{2} \sum_{j=1}^{J} \|F_M v_j - f_j\| + \sum_{l=1}^{L} \sum_{j=1}^{J} (\|R_l V - DX_l\|_F^2) \right\}. \quad (4)$$

In step e, the K-space data is updated by using the formula described as below.

$$f_j^{k+1} = f_j^k + f_j - F_M v_j^{k+1} \quad (5).$$

$f_j^k$ denotes a updated value of the k-th iteration of the j-th channel.

In step f, K-space data is subjected to an inverse Fourier transformation, and $v_j$ is re-updated so that the formula is obtained as below.

$$v_j^{k+1} = F^H f_j^{k+1} \quad (6).$$

In step g, an updated image is obtained based on the images $v_j$ of the all channels.

Preferably, in step a, constructing the reconstructed model is solving an $\ell_2-\ell_F-\ell_{2,1}$ minimization objective, where the $l_2$ norm is a data fitting term, the is norm a sparse representation error, and the $l_{2,1}$ mixed norm is the joint sparsity constraining across multiple channels.

Preferably, step a includes initializing $X^0$, $V_0$, $f_j^0$.

Preferably, in step b, the atoms are normalized so that atomic scale ambiguity of the dictionary is avoided.

Preferably, in step d, updating $v_j$ further includes the steps described below.

In step d1, according to a method of least squares, the formula is obtained as below.

$$\left(\lambda F_M^H F_M + \sum_{l=1}^{L} R_l^T R_l\right) v_j = \lambda F_M^H f_j + \sum_{l=1}^{L} R_l^T D X_{l,j}^{k+1}. \quad (7)$$

In the formula, $$\sum_{l=1}^{L} R_l^T R_l$$

denotes a diagonal matrix and diagonal entries correspond to image pixel locations with their values equal to the number of overlapping patches contributing at those pixel locations. It is assumed that patches wrap around at the image boundaries, the diagonal entries become all equal $$\sum_{l=1}^{L} R_1^T R_1 = \omega I_N \in R^{N \times N}.$$

Specifically, when the overlap stride is 1 for the patches, $\omega = M$.

In step d2, by a normalized full-sampling Fourier encoding matrix, an image domain is transformed into a Fourier domain so that the formula is obtained as below.

$$(\lambda F F_M^H F_M F^H + \omega I_N) F v_j = \lambda F F_M^H f_j + F\left(\sum_{l=1}^{L} R_l^R D X_{l,j}^{k+1}\right). \quad (8)$$

In the formula, $FF_M^H F_M F^H$ denotes a diagonal matrix of consisting of ones and zeros with ones corresponding to sampled locations in K-space, $\omega$ denotes the number of repeated pixels, $I_N$ denotes a unit matrix of N*N, and $\lambda F F_M^H f_j$ denotes a zero-filled Fourier measured value of the j-th channel.

In step d3, the formula in step d2 is transformed into the formula described as below.

$$Fv_j(k_x, k_y) = \begin{cases} \mathbb{F}(k_x, k_y) & (k_x, k_y) \notin \Omega_j \\ \dfrac{\mathbb{F}(k_x, k_y) + \eta \, \mathbb{F}_0(k_x, k_y)}{\eta + 1}, & (k_x, k_y) \in \Omega_j \end{cases}. \quad (9)$$

In the formula, $Fv_j(k_x,k_y)$ denotes an updated value of a K-space location $(k_x,k_y)$, and $\mathbb{F}_0 = FF_M^H f_j$ denotes a zero-filled K-space measured value of the j-th channel; $\eta$ denotes a small scalar, $\Omega$ denotes a subset of the K-space that has been sampled, $$\mathbb{F} = \frac{F\left(\sum_{l=1}^{L} R_1^T D X_{1=l,j}^{k+1}\right)}{\omega}, \text{ and}$$

$$\eta = \frac{\lambda}{\omega}.$$

In step d4, $v_j$ is obtained by the inverse Fourier transformation according to data in a frequency domain in the formula (9) in step d3.

Preferably, in step g, squares of the images $v_j$ of the all channels are summed up and a root operation is performed on the sum so that the updated image is obtained.

Another aspect of the present disclosure provides a parallel magnetic resonance imaging apparatus based on adaptive joint sparse codes. The parallel magnetic resonance imaging apparatus based on adaptive joint sparse codes includes a model construction module, an update module, and an imaging module. The model construction module is configured to construct a calibration-free parallel magnetic resonance imaging model based on joint sparse codes, that is, a reconstructed model, where the model is defined as the formula described below.

$$\{V^*, D^*, X^*\} = \theta(X, v_j, f_j, D) = \underset{V,D,X}{\arg\min} \left\{ \frac{\lambda}{2} \sum_{j=1}^{J} \|F_M v_j - f_j\| + \sum_{l=1}^{L} \left(\|R_l V - D X_l\|_F^2 + \beta \|X_l\|_{2,1}\right) \right\}. \quad (1)$$

In the formula, V denotes a reconstructed image, $D \xi c^{M \times P}$ denotes an overcomplete (P>>M) dictionary, $\theta$ denotes an objective function, $X=(X_{l,1}|X_{l,2} \ldots X_{l,j} \ldots ,|X_{l,J}) \in c^{P \times j}$ denotes a sparse matrix, $X_{l,j} \in c^P$ denotes an l-th extracted patch from a j-th channel image, $F_M$ denotes a Fourier transformation, $v_j$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vetorized size of the image, P denotes a number of the atoms, a subscript F denotes the Fourier transformation, $\lambda$ denotes a data fitting term weight, $\beta$ denotes a joint sparse regularization weight, and $\|\cdot\|_{2,1}$ denotes a joint sparse term.

In the formula $\|X_l\|_{2,1} = \Sigma_{p=1}^{P} \sqrt{\Sigma_{j=1}^{J} X_{l_p,j}^2}$, $X_{l_p,j}^2$ denotes a p-th pixel for the l-th extracted patch from the j-th channel image.

The update module includes a module for updating the joint sparse codes X, a module for updating the dictionary D, a module for updating the image $v_j$ of the each channel, and a module for updating the K-space data $f_j$.

The module for updating the dictionary D temporarily is configured to fix X, and learn the dictionary D by using a gradient descent method.

$$D^{k+1} = D^k - \gamma \frac{\partial \theta(D)}{\partial(D)}. \quad (2)$$

In the formula, γ denotes a learning rate, and k denotes a number of iterations.

$$\frac{\partial \theta(D)}{\partial(D)} = (DX - R_l V)X^H$$

applies, the formula $$\frac{\partial \theta(D)}{\partial(D)} = (DX - R_l V)X^H$$

denotes a reciprocal of the reconstructed objective function to the dictionary D, and H denotes conjugate transpose.

Therefore, the formula is obtained as below.

$$D^{k+1} = D^k - \gamma(DX - R_l V)X^H \quad (3).$$

The module for updating the image $v_j$ of the each channel is configured to update $v_j$ by using the formula described as below.

$$v_j^{k+1} = \theta(X^{k+1}, v_j, f_j^k) = \quad (4)$$
$$\arg\min_{v_j} \left\{ \frac{\lambda}{2} \sum_{j=1}^{J} \|F_M v_j - f_j\| + \sum_{l=1}^{L} \sum_{j=1}^{J} (\|R_l V - DX_l\|_F^2) \right\}.$$

The module for updating the K-space data $f_j$ is configured to update the K-space data by using the formula described as below.

$$f_j^{k+1} = f_j^k + f_j - F_M v_j^{k+1} \quad (5).$$

$f_j^k$ denotes a k-th iterative updated value of the j-th channel.

The module for updating the image $v_j$ of the each channel is further configured to perform an inverse Fourier transformation on the K-space data and re-update $v_j$ to obtain the formula described as below.

$$v_j^{k+1} = F^H f_j^{k+1} \quad (6).$$

The imaging module is configured to obtain an updated image based on the images $v_j$ of the all channels.

Preferably, the parallel magnetic resonance imaging apparatus based on adaptive joint sparse codes further includes an initialization module for initializing $X^0$, $V^0$, $f_j^0$.

Preferably, constructing the reconstructed model is constructed is solving an $\ell_2 - \ell_F - \ell_{2,1}$ minimization objective, where the $\ell_2$ norm is a data fitting term, the $\ell_F$ norm is a sparse representation error, and the $\ell_{2,1}$ mixed norm is the joint sparsity constraining across multiple channels.

Preferably, the update module is configured to perform normalization processing on the atoms while updating the dictionary D so as to avoid atomic scale ambiguity of the dictionary.

Preferably, the module for updating the image $v_j$ of the each channel is further configured to perform the steps described below.

In step d1, according to a method of least squares, the formula is obtained as below.

$$\left( \lambda F_M^H F_M + \sum_{l=1}^{L} R_l^T R_l \right) v_j = \lambda F_M^H f_j + \sum_{l=1}^{L} R_l^T D X_{l,j}^{k+1}. \quad (7)$$

In the formula, $$\sum_{l=1}^{L} R_l^T R_l$$

denotes a diagonal matrix and diagonal entries correspond to image pixel locations with their values equal to the number of overlapping patches contributing at those pixel locations. It is assumed that patches wrap around at the image boundaries, the diagonal entries become all equal $$\sum_{l=1}^{L} R_l^T R_l = \omega I_N \in R^{N \times N}.$$

Specifically, when the overlap stride is 1 for the patches, ω=M.

In step d2, by a normalized full-sampling Fourier encoding matrix, an image domain is transformed into a Fourier domain so that the formula is obtained as below.

$$(\lambda F F_M^H F_M F^H + \omega I_N) F v_j = \lambda F F_M^H f_j + F\left( \sum_{l=1}^{L} R_l^R D X_{l,j}^{k+1} \right). \quad (8)$$

In the formula, $FF_M^H F_M F^H$ denotes a diagonal matrix of consisting of ones and zeros with ones corresponding to sampled locations in K-space, ω denotes a number of repeated pixels, $I_N$ denotes a unit matrix of N*N, and $\lambda FF_M^H f_j$ denotes a zero-filled Fourier measured value of the j-th channel.

In step d3, the formula in step d2 is transformed into the formula described as below.

$$Fv_j(k_x, k_y) = \begin{cases} \mathbb{F}(k_x, k_y) & (k_x, k_y) \notin \Omega_j \\ \dfrac{\mathbb{F}(k_x, k_y) + \eta \mathbb{F}_0(k_x, k_y)}{\eta + 1} & (k_x, k_y) \in \Omega_j \end{cases}. \quad (9)$$

In the formula, $Fv_j(k_x, k_y)$ denotes an updated value of a K-space position $(k_x, k_y)$, and $\mathbb{F}_0 = FF_M^H f_j$ denotes a zero-filled K-space measured value of the j-th channel; η denotes a small scalar, Ω denotes a subset of the K-space that has been sampled, $$\mathbb{F} = \frac{F\left( \sum_{l=1}^{L} R_l^T D X_{l,j}^{k+1} \right)}{\omega}, \text{ and}$$

$$\eta = \frac{\lambda}{\omega}.$$

In step d4, $v_j$ is obtained by the inverse Fourier transformation according to data in a frequency domain in the formula (9) in step d3.

Preferably, the imaging module is configured to sum up squares of the images $v_j$ of the all channels and perform a root operation on the sum to obtain the updated image.

The present disclosure provides a computer-readable medium storing a program executable by a computer to cause the computer to perform the steps of the method for parallel magnetic resonance imaging based on adaptive joint sparse codes described above.

Advantageous Effects

In the method of the present disclosure, the joint sparsity of the channels is developed using the $\ell_{2,1}$ norm. In this manner, calibration is not required while information sparsity is developed. Moreover, the method is robust.

DETAILED DESCRIPTION

In the following description, many specific details are presented to provide a thorough understanding of the present disclosure. The present disclosure may be implemented without some or all of these specific details. In other cases, to avoid causing unnecessary confusion to the present disclosure, the well-known process operations are not detailed. Although the present disclosure will be described in conjunction with embodiments, it should be understood that these embodiments are not intended to limit the present disclosure.

Figure 1:
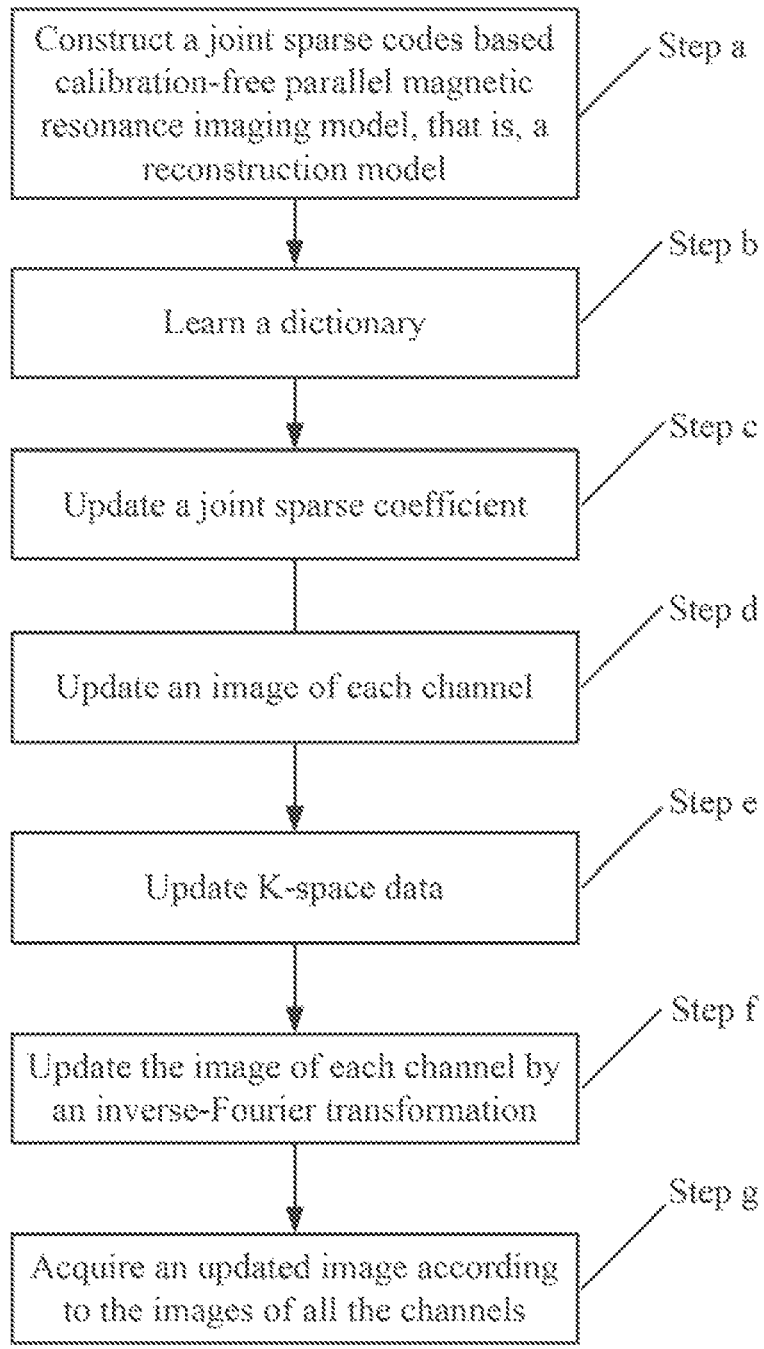
FIG. 1 is a flowchart of a parallel magnetic resonance imaging method based on adaptive joint sparse codes according to the present disclosure.

According to FIG. 1, a parallel magnetic resonance imaging method based on adaptive joint sparse codes provided by one embodiment of the present disclosure is described in detail.

In step a, a calibration-free parallel magnetic resonance imaging model based on joint sparse codes, that is, a reconstructed model is constructed, where the model is defined as the formula described below.

$$\{V^*, D^*, X^*\} = \theta(X, v_j, f_j, D) = \arg\min_{V,D,X}\left\{\frac{\lambda}{2}\sum_{j=1}^{J}\|F_M v_j - f_j\| + \sum_{l=1}^{L}\left(\|R_l V - DX_l\|_F^2 + \beta\|X_l\|_{2,1}\right)\right\}. \quad (1)$$

In the formula, V denotes a reconstructed image, $D \in c^{M \times P}$ denotes an overcomplete (P>>M) dictionary, θ denotes an objective function, $X=(X_{l,1}|X_{l,2}\ldots X_{l,j}\ldots,|X_{l,J}) \in c^{P \times J}$ denotes a sparse matrix, $X_{l,j} \in c^P$ denotes an l-th extracted patch from a j-th channel image, $F_M$ denotes a Fourier transformation, $v_j$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vetorized size of the image, P denotes a number of atoms, a subscript F denotes the Fourier transformation, λ denotes a data fitting term weight, β denotes a joint sparse regularization weight, and $\|\cdot\|_{2,1}$ denotes a joint sparse term.

In the formula $\|X_l\|_{2,1} = \Sigma_{p=1}^{P}\sqrt{\Sigma_{j=1}^{J}X_{l_p,j}^2}$, $X_{l_p,j}^2$ denotes a p-th pixel for the l-th extracted patch from the j-th channel image.

In step a, constructing the reconstructed model is solving an $\ell_2 - \ell_F - \ell_{2,1}$ minimization objective, where the $\ell_2$ norm is a data fitting term, the $\ell_F$ norm is a sparse representation error, and the $\ell_{2,1}$ mixed norm is the joint sparsity constraining across multiple channels.

In step b, X is temporarily fixed, and the dictionary D is learned by using a gradient descent method.

$$D^{k+1} = D^k - \gamma\frac{\partial\theta(D)}{\partial(D)}. \quad (2)$$

In the formula, γ denotes a learning rate, and k denotes a number of iterations.

$$\frac{\partial\theta(D)}{\partial(D)} = (DX - R_l V)X^H$$

applies, the formula $$\frac{\partial\theta(D)}{\partial(D)} = (DX - R_l V)X^H$$

denotes a reciprocal of the reconstructed objective function to the dictionary D, and H denotes conjugate transpose. Therefore, the formula is obtained as below.

$$D^{k+1} = D^k - \gamma(DX - R_l V)X^H \quad (3).$$

In step b, normalization processing is performed on the atoms so that atomic scale ambiguity of the dictionary is avoided.

In step c, the joint sparse coefficient X is updated until the number of inner iterations reaches a specific number of times.

$$X_{l,j}^{k+1,q+1} = Jsoftshrinkage\left(B_{l,j}^q, \frac{\beta}{2\alpha}\right).$$

q denotes the number of times of a layer of loop nested in an inner loop, B denotes an auxiliary variable, and α denotes an auxiliary parameter.

In step d, the image of the each channel is updated by using the formula described as below.

$$v_j^{k+1} = \theta(X^{k+1}, v_j, f_j^k) = \arg\min_{v_j}\left\{\frac{\lambda}{2}\sum_{j=1}^{J}\|F_M v_j - f_j\| + \sum_{l=1}^{L}\sum_{j=1}^{J}\left(\|R_l V - DX_l\|_F^2\right)\right\}. \quad (4)$$

In step d, updating $v_j$ further includes the steps described below.

In step d1, according to a method of least squares, the formula is obtained as below.

$$\left(\lambda F_M^H F_M + \sum_{l=1}^{L}R_l^T R_l\right)v_j = \lambda F_M^H f_j + \sum_{l=1}^{L}R_l^T DX_{l,j}^{k+1}. \quad (7)$$

In the formula, $$\sum_{l=1}^{L} R_l^T R_l$$

denotes a diagonal matrix and diagonal entries correspond to image pixel locations with their values equal to the number of overlapping patches contributing at those pixel locations. It is assumed that patches wrap around at the image boundaries, the diagonal entries become all equal $$\sum_{l=1}^{L} R_1^T R_1 = \omega I_N \in R^{N \times N}.$$

Specifically, when the overlap stride is 1 for the patches, $\omega = M$.

In step d2, by a normalized full-sampling Fourier encoding matrix, an image domain is transformed into a Fourier domain so that the formula is obtained as below.

$$(\lambda F F_M^H F_M F^H + \omega I_N) F v_j = \lambda F F_M^H f_j + F\left(\sum_{l=1}^{L} R_l^R D X_{l,j}^{k+1}\right) \quad (8)$$

In the formula, $FF_M{}^H F_M F^H$ denotes a diagonal matrix consisting of ones and zeros with ones corresponding to sampled locations in K-space, $\omega$ denotes the number of repeated pixels, $I_N$ denotes a unit matrix of N*N, and $\lambda FF_M{}^H f_j$ denotes a zero-filled Fourier measured value of the j-th channel.

In step d3, the formula in step d2 is transformed into the formula described as below.

$$Fv_j(k_x, k_y) = \begin{cases} \mathbb{F}(k_x, k_y) & (k_x, k_y) \notin \Omega_j \\ \dfrac{\mathbb{F}(k_x, k_y) + \eta \mathbb{F}_0(k_x, k_y)}{\eta + 1} & (k_x, k_y) \in \Omega_j \end{cases} \quad (9)$$

In the formula, $Fv_j(k_x, k_y)$ denotes an updated value of a K-space position $(k_x, k_y)$, and $\mathbb{F}_0 = FF_M{}^{HL} f_j$ denotes a zero-filled K-space measured value of the j-th channel; $\eta$ denotes a small scalar, $\Omega$ denotes a subset of the K-space that has been sampled, $$\mathbb{F} = \dfrac{F\left(\sum_{l=1}^{L} R_1^T D X_{1,j}^{k+1}\right)}{\omega}, \text{ and } \eta = \dfrac{\lambda}{\omega}.$$

In step d4, $v_j$ is obtained by an inverse Fourier transformation according to data in a frequency domain in the formula (9) in step d3.

In step e, the K-space data is updated by using the formula described as below.

$$f_j^{k+1} = f_j^k + f_j - F_M v_j^{k+1} \quad (5).$$

$f_j^k$ denotes a updated value of the k-th iteration of the j-th channel.

In step f, the inverse Fourier transformation is performed on the K-space data and $v_j$ is re-updated so that the formula is obtained as below.

$$v_j^{k+1} = F^H f_j^{k+1} \quad (6).$$

In step g, squares of the images $v_j$ of the all channels are summed up and a root operation is performed on the sum so that the updated image is obtained.

In the existing parallel magnetic resonance imaging method, two-dimensional random undersampling is generally utilized. This sampling mode causes noise-like artifacts and loss and blurring of details in the image of a direct inverse Fourier transformation. In the method provided by the present disclosure, high-quality magnetic resonance image reconstruction accelerated to four times is achieved through an overall model and algorithm. Specifically, the joint sparse norm can well inhibit the noise, the structural information of the image can be adaptively acquired through updating of the dictionary, and the reconstruction quality with the minimum error can be achieved by using the accurate iterative loop solution of the overall algorithm.

Furthermore, the present disclosure further provides a computer-readable medium storing a program executable by a computer to cause the computer to perform the processings including the steps described above.

The present disclosure further provides a parallel magnetic resonance imaging apparatus based on adaptive joint sparse codes, which is configured to perform the methods described above. The parallel magnetic resonance imaging apparatus based on adaptive joint sparse codes includes different modules, which are configured to perform the steps mentioned in the methods described above.

Figure 2:
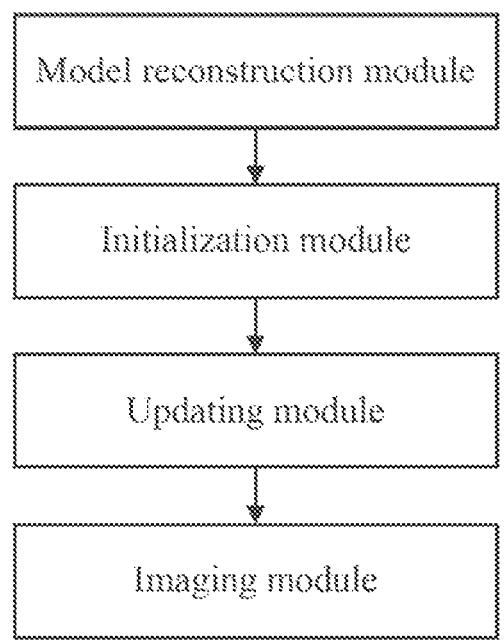
FIG. 2 is a block diagram of a parallel magnetic resonance imaging apparatus based on adaptive joint sparse codes according to the present disclosure.

The parallel magnetic resonance imaging apparatus based on adaptive joint sparse codes provided by one embodiment of the present disclosure is described according to FIG. 2. For example, the apparatus includes a model construction module, an update module, and an imaging module. The model construction module is configured to construct a calibration-free parallel magnetic resonance imaging model based on joint sparse codes, that is, a reconstructed model. The update module includes a module for updating the joint sparse codes X, a module for updating the dictionary D, a module for updating the image $v_j$ of the each channel, and a module for updating the K-space data $f_j$. The imaging module is configured to obtain an updated image based on the images $v_j$ of the all channels. Preferably, the parallel magnetic resonance imaging apparatus based on adaptive joint sparse codes further includes an initialization module for initializing $X^0$, $V^0$, $f_j^0$.

In the model construction module, constructing the reconstructed model is solving an $\ell_2 - \ell_F - \ell_{2,1}$ minimization objective, where the $\ell_2$ norm is a data fitting term, the $\ell_F$ norm is a sparse representation error, and the $\ell_{2,1}$ mixed norm is the joint sparsity constraining across multiple channels.

Preferably, the update module is configured to perform normalization processing on the atoms while updating the dictionary D so as to avoid atomic scale ambiguity of the dictionary.

Preferably, the imaging module is configured to sum up squares of the images $v_j$ of the all channels and perform a root operation on the sum to obtain the updated image.

Although the present disclosure is described through the preferred embodiments, modifications, permutations and various equivalent substitutions are possible within the scope of the present disclosure. It is also to be noted that there are many alternative ways of implementing the method and system of the present disclosure. Therefore, the appended claims are intended to be construed to include all the modifications, permutations and various equivalent substitutions within the spirit and scope of the present disclosure.

What is claimed is:

1. A parallel magnetic resonance imaging method based on adaptive joint sparse codes, applied by a parallel magnetic resonance imaging apparatus, comprising:

step a: constructing a calibration-free parallel magnetic resonance imaging model based on joint sparse codes, that is, a reconstructed model, wherein the model is defined as:

$$\{V^*, D^*, X^*\} = \theta(X, v_j, f_j, D) = \underset{V,D,X}{\operatorname{argmin}}\left\{\frac{\lambda}{2}\sum_{j=1}^{J}\|F_M v_j - f_j\| + \sum_{l=1}^{L}(\|R_l V - DX_l\|_F^2 + \beta\|X_l\|_{2,1})\right\}, \quad (1)$$

wherein V denotes a reconstructed image, $D \in c^{M \times P}$ denotes an overcomplete (P>>M) dictionary, $\theta$ denotes an objective function, $X=(X_{l,1}|X_{l,2}\ldots X_{l,j}\ldots|X_{l,j}) \in c^{P \times j}$ denotes a sparse matrix, $X_{l,j} \in c^P$ denotes an l-th extracted patch from a j-th channel image, $F_M$ denotes a Fourier transformation, $v_j$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vectorized size of the image, P denotes a number of atoms, a subscript F denotes the Fourier transformation, $\lambda$ denotes a data fitting term weight, $\beta$ denotes a joint sparse regularization weight, and $\|X_l\|_{2,1}$ denotes a joint sparse term, and wherein $$\|X_l\|_{2,1} = \sum_{p=1}^{p}\sqrt{\sum_{j=1}^{j} X_{l_p,j}^2},$$

wherein $X_{l_p,j}^2$, denotes a p-th pixel for the l-th extracted patch from the j-th channel image;

step b: temporarily fixing X, and solving the dictionary D by using a gradient descent method:

$$D^{k+1} = D^k - \gamma \frac{\partial \theta(D)}{\partial(D)}, \quad (2)$$

wherein $\gamma$ denotes a learning rate, and k denotes a number of iterations, and wherein $$\frac{\partial \theta(D)}{\partial(D)} = (DX - R_l V)X^H$$

applies, wherein the formula $$\frac{\partial \theta(D)}{\partial(D)} = (DX - R_l V)X^H$$

denotes a reciprocal of the reconstructed objective function to the dictionary D and H denotes conjugate transpose, and thus the following formula is obtained:

$$D^{k+1}=D^k-\gamma(DX-R_l V)X^H \quad (3);$$

step c: updating joint sparse coefficient X;

step d: updating $v_j$ by using the following formula:

$$v_j^{k+1} = \theta(X^{k+1}, v_j, f_j^k) = \underset{v_j}{\operatorname{argmin}}\left\{\frac{\lambda}{2}\sum_{j=1}^{J}\|F_M v_j - f_j\| + \sum_{l=1}^{L}\sum_{j=1}^{J}(\|R_l V - DX_l\|_F^2)\right\}; \quad (4)$$

step e: updating the K-space data by using the following formula:

$$f_j^{k+1}=f_j^k+f_j-F_M v_j^{k+1} \quad (5),$$

wherein $f_j^k$ denotes an updated value of a k-th iteration of the j-th channel;

step f: performing an inverse Fourier transformation on the K-space data and re-updating $v_j$ to obtain the following formula:

$$v_j^{k+1}=F^H f_j^{k+1} \quad (6); \text{ and}$$

step g: obtaining an updated image based on the images $v_j$ of the all channels.

2. The method of claim 1, wherein in step a, constructing the reconstructed model is solving an $l_2-l_F-l_{2,1}$ minimization objective, wherein the $l_2$ norm is a data fitting term, the $l_F$ norm is a sparse representation error, and the $l_{2,1}$ mixed norm is a joint sparsity constraining across multiple channels.

3. The method of claim 1, wherein step a comprises a step of initializing $X^0, V_0, f_j^0$.

4. The method of claim 1, wherein in step b, the atoms are normalized so that atomic scale ambiguity of the dictionary is avoided.

5. The method of claim 1, wherein in step d, updating $v_j$ further comprises:

step d1: according to a least square method, obtaining the following formula:

$$\left(\lambda F_M^H F_M + \sum_{l=1}^{L} R_l^T R_l\right)v_j = \lambda F_M^H f_j + \sum_{l=1}^{L} R_l^T DX_{l,j}^{k+1}, \quad (7)$$

wherein $\sum_{l=1}^{L} R_l^T R_l$ wherein $$\sum_{l=1}^{L} R_l^T R_l$$

denotes a diagonal matrix and diagonal entries correspond to image pixel locations with their values equal to the number of overlapping patches contributing at those pixel locations, assuming that patches wrap around image boundaries, the $$\sum_{l=1}^{L} R_l^T R_l = \omega I_N \in R^{N \times N},$$

diagonal entries become all equal specifically, when the overlap stride is 1 for the patches, ω=M;

step d2: by a normalized full-sampling Fourier encoding matrix, transforming an image domain into a Fourier domain to obtain the following formula:

$$(\lambda F F_M^H F_M F^H + \omega I_N) F v_j = \lambda F F_M^H f_j + F\left(\sum_{l=1}^{L} R_l^R D X_{l,j}^{k+1}\right), \quad (8)$$

wherein $FF_M{}^H F_M F^H$ denotes a diagonal matrix consisting of ones and zeros with ones corresponding to sampled locations in K-space, ω denotes a number of repeated pixels, $I_N$ denotes a unit matrix of N*N, and $\lambda F F_M{}^H f_j$ denotes a zero-filled Fourier measured value of the j-th channel;

step d3: transforming the formula in step d2 into:

$$F v_j(k_x, k_y) = \begin{cases} \mathbb{F}(k_x, k_y) & (k_x, k_y) \notin \Omega_j \\ \dfrac{\mathbb{F}(k_x, k_y) + \eta \mathbb{F}_0(k_x, k_y)}{\eta + 1}, & (k_x, k_y) \in \Omega_j \end{cases}, \quad (9)$$

wherein $Fv_j(k_x, k_y)$ denotes an updated value of a K-space position $(k_x, k_y)$, and $\mathbb{F}_0 = FF_M{}^H f_j$ denotes a zero-filled K-space measured value of the j-th channel; η denotes a small scalar, Ω denotes a subset of the K-space that has been sampled, $$\mathbb{F} = \dfrac{F\left(\sum_{l=1}^{L} R_l^T D X_{l,j}^{k+1}\right)}{\omega}, \text{ and } \eta = \dfrac{\lambda}{\omega};$$

and step d4: obtaining $v_j$ by the inverse Fourier transformation according to data in a frequency domain in the formula (9) in step d3.

6. The method of claim 1, wherein in step g, squares of the images $v_j$ of the all channels are summed up and a root operation is performed on the sum so that the updated image is obtained.

7. A parallel magnetic resonance imaging apparatus based on adaptive joint sparse codes, comprising:
a model construction module, which is configured to construct a calibration-free parallel magnetic resonance imaging model based on joint sparse codes, that is, a reconstructed model, wherein the model is defined as:

$$\{V^*, D^*, X^*\} = \theta(X, v_j, f_j, D) = \underset{V,D,X}{\operatorname{argmin}}\left\{\dfrac{\lambda}{2}\sum_{j=1}^{J}\|F_M v_j - f_j\| + \sum_{l=1}^{L}(\|R_l V - DX_l\|_F^2 + \beta\|X_l\|_{2,1})\right\}, \quad (1)$$

wherein V denotes a reconstructed image, $D \in c^{M \times P}$ denotes an overcomplete (P >> M) dictionary, θ denotes an objective function, $X = (X_{l,1}|X_{l,2} \ldots X_{l,j} \ldots |X_{l,J}) \in c^{P \times j}$ denotes a sparse matrix, $X_{l,j} \in c^P$ denotes an l-th extracted patch from a j-th channel image, $F_M$ denotes a Fourier transformation, $V_l$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vectorized size of the image, P denotes a number of atoms, a subscript F denotes the Fourier transformation, λ denotes a data fitting term weight, β denotes a joint sparse regularization weight, and $X_{2,1}$ denotes a joint sparse term, and wherein $$\|X_l\|_{2,1} = \sum_{p=1}^{p} \sqrt{\sum_{j=1}^{j} X_{l_p,j}^2},$$

wherein $X_{l_p,j}{}^2$ denotes a p-th pixel for the l-th extracted patch from the j-th channel image;

an update module an imaging module, comprising a module for updating the joint sparse codes X, a module for updating the dictionary D, a module for updating the image $v_j$ of the each channel, and a module for updating the K-space data $f_j$, wherein the module for updating the dictionary D is configured to temporarily fix X, and learn the dictionary D by using a gradient descent method:

$$D^{k+1} = D^k - \gamma \dfrac{\partial \theta(D)}{\partial(D)}, \quad (2)$$

wherein γ denotes a learning rate, and k denotes a number of iterations, and wherein $$\dfrac{\partial \theta(D)}{\partial(D)} = (DX - R_l V) X^H$$

applies, wherein the formula $$\dfrac{\partial \theta(D)}{\partial(D)} = (DX - R_l V) X^H$$

denotes a reciprocal of the reconstructed objective function to the dictionary D, and H denotes conjugate transpose, and thus the following formula is obtained:

$$D^{k+1} = D^k - \gamma(DX - R_l V) X^H \quad (3);$$

the module for updating the image $v_j$ of the each channel is configured to update $v_j$ by using the following formula:

$$v_j^{k+1} = \quad (4)$$

$$\theta(X^{k+1}, v_j, f_j^k) = \underset{v_j}{\operatorname{argmin}}\left\{\dfrac{\lambda}{2}\sum_{j=1}^{J}\|F_M v_j - f_j\| + \sum_{l=1}^{L}\sum_{j=1}^{J}(\|R_l V - DX_l\|_F^2)\right\};$$

the module for updating the K-space data f is configured to update the K-space data by using the following formula:

$$f_j^{k+1} = f_j^k + f_j - F_M v_j^{k+1} \quad (5),$$

wherein $f_j^k$ denotes a k-th iterative updated value of the j-th channel;

the module for updating the image $v_j$ of the each channel is further configured to perform an inverse Fourier transformation on the K-space data and re-update $v_j$ to obtain the following formula:

$$v_j^{k+1} = F^H f_j^{k+1} \quad (6); \text{ and}$$

an imaging module, which is configured to obtain an updated image based on the images $v_j$ of the all channels.

8. The parallel magnetic resonance imaging apparatus based on adaptive joint sparse codes of claim 7, further comprising an initialization module for initializing $X^0$, $V_0$, $f_j^0$.

9. The parallel magnetic resonance imaging apparatus based on adaptive joint sparse codes of claim 7, wherein constructing the reconstructed model is solving an $l_2$–$l_F$–$l_{2,1}$ minimization objective, wherein the $l_2$ norm is a data fitting term, the $l_F$ norm is a sparse representation error, and the $l_{2,1}$ mixed norm is a joint sparsity constraining across multiple channels.

10. The parallel magnetic resonance imaging apparatus based on adaptive joint sparse codes of claim 7, wherein the update module is configured to normalize the atoms while updating the dictionary D so as to avoid atomic scale ambiguity of the dictionary.

11. The parallel magnetic resonance imaging apparatus based on adaptive joint sparse codes of claim 7, wherein the module for updating the image $v_j$ of the each channel is further configured to:

step d1: according to a method of least squares, obtain the following formula:

$$\left(\lambda F_M^H F_M + \sum_{l=1}^{L} R_l^T R_l\right) v_j = \lambda F_M^H f_j + \sum_{l=1}^{L} R_l^T D X_{l,j}^{k+1} \quad (7)$$

wherein $\sum_{l=1}^{L} R_l^T R_l$, wherein $$\sum_{l=1}^{L} R_l^T R_l$$

denotes a diagonal matrix and diagonal entries correspond to image pixel locations with their values equal to the number of overlapping patches contributing at those pixel locations; assuming that patches wrap around at image boundaries, the diagonal entries become all equal $$\sum_{l=1}^{L} R_l^T R_l = \omega I_N \in R^{N \times N};$$

specifically, when the overlap stride is 1 for the patches, step d2: by a normalized full-sampling Fourier encoding matrix, transform an image domain into a Fourier domain to obtain the following formula:

$$(\lambda F F_M^H F_M F^H + \omega I_N) F v_j = \lambda F F_M^H f_j + F\left(\sum_{l=1}^{L} R_l^R D X_{l,j}^{k+1}\right), \quad (8)$$

wherein $FF_M^H F_M F^H$ denotes a diagonal matrix consisting of ones and zeros with ones corresponding to sampled locations in K-space, $\omega$ denotes a number of repeated pixels, $I_N$ denotes a unit matrix of N*N, and $\lambda F F_M^H f_j$ denotes a zero-filled Fourier measured value of the j-th channel;

step d3: transform the formula in step d2 into:

$$Fv_j(k_x, k_y) = \begin{cases} \mathbb{F}(k_x, k_y) & (k_x, k_y) \notin \Omega_j \\ \dfrac{\mathbb{F}(k_x, k_y) + \eta \mathbb{F}_0(k_x, k_y)}{\eta + 1}, & (k_x, k_y) \in \Omega_j \end{cases}, \quad (9)$$

wherein $Fv_j(k_x, k_y)$ denotes an updated value of a K-space position $k_x, k_y$, and $\mathbb{F}_0 = FF_M^H f_j$ denotes a zero-filled K-space measured value of the j-th channel; $\eta$ denotes a small scalar, $\Omega$ denotes a subset of the K-space that has been sampled, $$\mathbb{F} = \dfrac{F\left(\sum_{l=1}^{L} R_l^T D X_{l,j}^{k+1}\right)}{\omega}, \text{ and } \eta = \dfrac{\lambda}{\omega};$$

and step d4: obtain $v_j$ by the inverse Fourier transformation according to data in a frequency domain in the formula (9) in step d3.

12. The parallel magnetic resonance imaging apparatus based on adaptive joint sparse codes of claim 7, wherein the imaging module is configured to sum up squares of the images $v_j$ of the all channels and perform a root operation on the sum to obtain the updated image.

13. A non-transitory computer-readable medium storing a program executable by a computer to cause the computer to perform a parallel magnetic resonance imaging method based on adaptive joint sparse codes, wherein the method comprises:

step a: constructing a calibration-free parallel magnetic resonance imaging model based on joint sparse codes, that is, a reconstructed model, wherein the model is defined as:

$$\{V^*, D^*, X^*\} = \theta(X, v_j, f_j, D) = \quad (1)$$

$$\underset{V,D,X}{\mathrm{argmin}} \left\{ \dfrac{\lambda}{2} \sum_{j=1}^{J} \|F_M v_j - f_j\| + \sum_{l=1}^{L} (\|R_l V - D X_l\|_F^2 + \beta \|X_l\|_{2,1}) \right\},$$

wherein V denotes a reconstructed image, $D \in c^{M \times P}$ denotes an overcomplete (P >> M) dictionary, $\theta$ denotes an objective function, $X = (X_{l,1} | X_{l,2} \ldots X_{l,j} \ldots, | X_{l,J}) \in c^{P \times J}$ denotes a sparse matrix, $X_{l,j} \in c^P$ denotes an l-th extracted patch from a j-th channel image, FM denotes a Fourier transformation, $v_j$ denotes an image of each channel, V denotes a matrix formed by images $v_j$ of all channels, $f_j$ denotes K-space data, $R_l \in c^{M \times N}$ denotes a patch extraction matrix, M denotes an atom size, N denotes a vectorized size of the image, P denotes a number of atoms, a subscript F denotes the Fourier transformation, λ denotes a data fitting term weight, β denotes a joint sparse regularization weight, and $X_{2,1}$ denotes a joint sparse term, and
wherein $$\|X_l\|_{2,1} = \sum_{p=1}^{p} \sqrt{\sum_{j=1}^{j} X_{l_{p,j}}^2},$$

wherein $X_{l_{p,j}}^2$ denotes a p-th pixel for the l-th extracted patch from the j-th channel image;

step b: temporarily fixing X, and solving the dictionary D by using a gradient descent method:

$$D^{k+1} = D^k - \gamma \frac{\partial \theta(D)}{\partial(D)}. \qquad (2)$$

wherein γ denotes a learning rate, and k denotes a number of iterations, and
wherein $$\frac{\partial \theta(D)}{\partial(D)} = (DX - R_l V) X^H \qquad (3)$$

applies, wherein the formula $$\frac{\partial \theta(D)}{\partial(D)} = (DX - R_l V) X^H$$

denotes a reciprocal of the reconstructed objective function to the dictionary D and H denotes conjugate transpose, and thus the following formula is obtained:

$$D^{k+1} = D^k - \gamma(DX - R_l V) X^H \qquad (3);$$

step c: updating joint sparse coefficient X;
step d: updating $v_j$ by using the following formula:

$$v_j^{k+1} = \qquad (4)$$

$$\theta(X^{k+1}, v_j, f_j^k) = \underset{v_j}{\mathrm{argmin}} \left\{ \frac{\lambda}{2} \sum_{j=1}^{J} \|F_M v_j - f_j\| + \sum_{l=1}^{L} \sum_{j=1}^{J} (\|R_l V - DX_l\|_F^2) \right\};$$

step e: updating the K-space data by using the following formula:

$$f_j^{k+1} = f_j^k + f_j - F_M v_j^{k+1} \qquad (5),$$

wherein $f_j^k$ denotes an updated value of a k-th iteration of the j-th channel;

step f: performing an inverse Fourier transformation on the K-space data and re-updating $v_j$ to obtain the following formula:

$$v_j^{k+1} = F^H f_j^{k+1} \qquad (6); \text{ and}$$

step g: obtaining an updated image based on the images $v_j$ of the all channels.

14. The computer-readable medium of claim 13, wherein in step a, constructing the reconstructed model is solving an $l_2$-$l_F$-$l_{2,1}$ minimization objective, wherein the $l_2$ norm is a data fitting term, the $l_F$ norm is a sparse representation error, and the $l_{2,1}$ mixed norm is a joint sparsity constraining across multiple channels.

15. The computer-readable medium of claim 13, wherein step a comprises a step of initializing $X^0$, $V_0$, $f_j^0$.

16. The computer-readable medium of claim 13, wherein in step b, the atoms are normalized so that atomic scale ambiguity of the dictionary is avoided.

17. The computer-readable medium of claim 13, wherein in step d, updating $v_j$ further comprises:

step d1: according to a least square method, obtaining the following formula:

$$\left( \lambda F_M^H F_M + \sum_{l=1}^{L} R_l^T R_l \right) v_j = \lambda F_M^H f_j + \sum_{l=1}^{L} R_l^T D X_{l,j}^{k+1} \qquad (7)$$

wherein $\sum_{l=1}^{L} R_l^T R_l$, wherein $$\sum_{l=1}^{L} R_l^T R_l$$

denotes a diagonal matrix and diagonal entries correspond to image pixel locations with their values equal to the number of overlapping patches contributing at those pixel locations, assuming that patches wrap around at the image boundaries, the diagonal entries become all equal $$\sum_{l=1}^{L} R_l^T R_l = \omega I_N \in R^{N \times N},$$

specifically, when the overlap stride is 1 for the patches, ω=M;

step d2: by a normalized full-sampling Fourier encoding matrix, transforming an image domain into a Fourier domain to obtain the following formula:

$$(\lambda F F_M^H F_M F^H + \omega I_N) F v_j = \lambda F F_M^H f_j + F \left( \sum_{l=1}^{L} R_l^R D X_{l,j}^{k+1} \right), \qquad (8)$$

wherein $FF_M^H F_M F^H$ denotes a diagonal matrix consisting of ones and zeros with ones corresponding to sampled locations in K-space, $^\omega$denotes a number of repeated pixels, $I_N$ denotes a unit matrix of N*N, and $\lambda F F_M^H f_j$ denotes a zero-filled Fourier measured value of the j-th channel;

step d3: transforming the formula in step d2 into:

$$Fv_j(k_x, k_y) = \begin{cases} \mathbb{F}(k_x, k_y) & (k_x, k_y) \notin \Omega_j \\ \dfrac{\mathbb{F}(k_x, k_y) + \eta \mathbb{F}_0(k_x, k_y)}{\eta + 1}, & (k_x, k_y) \in \Omega_j \end{cases}, \qquad (9)$$

wherein $Fv_j(k_x,k_y)$ denotes an updated value of a K-space position $(k_x,k_y)$, and $\mathbb{F}_0 = FF_M^H f_j$ denotes a zero-filled K-space measured value of the j-th channel; $\eta$ denotes a small scalar, $\Omega$ denotes a subset of the K-space that has been sampled, $$\mathbb{F} = \frac{F\left(\sum_{l=1}^{L} R_l^T D X_{l,j}^{k+1}\right)}{\omega}, \text{ and } \eta = \frac{\lambda}{\omega};$$

and step d4: obtaining $v_j$ by the inverse Fourier transformation according to data in a frequency domain in the formula (9) in step d3.

18. The computer-readable medium of claim 13, wherein in step g, squares of the images $v_j$ of the all channels are summed up and a root operation is performed on the sum so that the updated image is obtained.

* * * * *